(12) United States Patent
Hatakenaka et al.

(10) Patent No.: US 10,475,916 B2
(45) Date of Patent: Nov. 12, 2019

(54) SEMICONDUCTOR DEVICE AND MANUFACTURING METHOD THEREOF

(71) Applicant: ABLIC Inc., Chiba-shi, Chiba (JP)

(72) Inventors: Masahiro Hatakenaka, Chiba (JP); Mitsuhiro Yoshimura, Chiba (JP)

(73) Assignee: ABLIC INC., Chiba (JP)

( * ) Notice: Subject to any disclaimer, the term of this patent is extended or adjusted under 35 U.S.C. 154(b) by 0 days.

(21) Appl. No.: 15/938,176

(22) Filed: Mar. 28, 2018

(65) Prior Publication Data

US 2018/0286975 A1 Oct. 4, 2018

(30) Foreign Application Priority Data

Mar. 30, 2017 (JP) .................... 2017-068171

(51) Int. Cl.
| | | |
|---|---|---|
| *H01L 29/78* | (2006.01) | |
| *H01L 29/06* | (2006.01) | |
| *H01L 21/768* | (2006.01) | |
| *H01L 29/66* | (2006.01) | |
| *H01L 23/522* | (2006.01) | |

(52) U.S. Cl.
CPC .... *H01L 29/7813* (2013.01); *H01L 21/76831* (2013.01); *H01L 21/76897* (2013.01); *H01L 23/5226* (2013.01); *H01L 29/0696* (2013.01); *H01L 29/66734* (2013.01); *H01L 29/0646* (2013.01); *H01L 29/0649* (2013.01)

(58) Field of Classification Search
CPC ............. H01L 29/7813; H01L 29/0696; H01L 29/66734; H01L 29/0646; H01L 29/0649; H01L 21/76831; H01L 21/76897; H01L 23/5226

USPC .............. 257/330, 332, 334, 356, 363, 797, 257/E29.027, E29.028, E29.066, E29.136, 257/E29.131, E29.141, E29.255, E29.262, 257/E27.016, E27.014, E21.159, E21.409, 257/E21.41, E21.51, E21.616; 438/589, 438/197, 238, 270, 401, 424, 454
See application file for complete search history.

(56) References Cited

U.S. PATENT DOCUMENTS

| | | | | |
|---|---|---|---|---|
| 7,504,306 | B2* | 3/2009 | Sapp .................... | H01L 29/0869 438/270 |
| 8,008,716 | B2* | 8/2011 | Lui .................. | H01L 21/823487 257/330 |
| 8,236,651 | B2* | 8/2012 | Chen ................... | H01L 29/7813 438/270 |
| 8,563,377 | B2* | 10/2013 | Yedinak .............. | H01L 29/0692 438/259 |
| 2002/0009867 | A1* | 1/2002 | Numazawa ....... | H01L 21/28185 438/589 |
| 2008/0079081 | A1* | 4/2008 | Hashimoto ....... | H01L 29/66727 257/363 |

(Continued)

FOREIGN PATENT DOCUMENTS

JP    2014-072412 A    4/2014

*Primary Examiner* — Dao H Nguyen
(74) *Attorney, Agent, or Firm* — Brinks Gilson & Lione

(57) ABSTRACT

A semiconductor device in which a trench in a cell outer peripheral region configured to pull out a gate electrode and a trench in a cell region having a vertical transistor are formed with the same width to enable a reduction in chip area, and a manufacturing method thereof in which a gate contact hole is formed directly on a trench in a cell outer peripheral region on a self-alignment basis, and a gate wiring electrode is connected thereto are provided.

17 Claims, 9 Drawing Sheets

(56) References Cited

U.S. PATENT DOCUMENTS

2009/0200607 A1* 8/2009 Matsuura .......... H01L 29/41741
257/332
2010/0270613 A1* 10/2010 Takehara .............. H01L 29/407
257/332
2014/0091387 A1 4/2014 Kobayashi

* cited by examiner

SEMICONDUCTOR DEVICE AND MANUFACTURING METHOD THEREOF

RELATED APPLICATIONS

This application claims priority under 35 U.S.C. § 119 to Japanese Patent Application No. 2017-068171 filed on Mar. 30, 2017, the entire content of which is hereby incorporated by reference.

BACKGROUND OF THE INVENTION

Field of the Invention

The present invention relates to a semiconductor device and a manufacturing method thereof, and particularly to a semiconductor device having a vertical MOSFET with a trench gate, and a manufacturing method thereof.

Description of the Related Art

There has been known, as one of vertical MOSFETs, one having a structure with a trench gate, in which a gate electrode is embedded into a trench formed in a substrate to make a current flow in a vertical direction. As a method of electrically connecting such a gate electrode lying inside the trench to a gate pad via a gate metal wiring, there has been proposed in, for example, Japanese Patent Application Laid-Open No. 2014-72412, a configuration in which a gate contact hole penetrating an interlayer insulating film on a trench is formed directly on the trench. Thus, the gate electrode can be connected to the gate metal wiring without providing the gate electrode on a gate insulating film at an upper corner portion of the trench, whose breakdown voltage for insulation is low, thereby enabling an improvement in reliability against the breakdown of the gate insulating film and an improvement in transistor performance by a reduction in gate resistance.

SUMMARY OF THE INVENTION

However, in the related art for the method of directly forming the gate contact hole on the trench disclosed in Japanese Patent Application Laid-Open No. 2014-72412, since it is necessary to consider the effect of variations in process and to form the width of the trench wider than that of the gate contact hole, the width of the trench cannot be reduced, and there is room for a further improvement over a reduction in chip area.

In view of the foregoing, the present invention aims to provide a semiconductor device capable of reducing a chip area, and a manufacturing method thereof.

A semiconductor device according to one embodiment of the present invention has the following configuration.

There is provided a semiconductor device which is equipped with a cell region having a trench formed in a substrate, a gate insulating film formed to cover a bottom and side surfaces inside the trench, and a gate electrode embedded in the trench along the gate insulating film and including a vertical transistor, and a cell outer peripheral region including a gate metal wiring formed on the gate electrode, in which the cell outer peripheral region is equipped with the gate electrode embedded within the trench up to a prescribed height lower than the surface of the substrate and higher than the bottom surface of the trench, a sidewall insulation region provided along the side surface of the trench from the prescribed height to the height of the surface of the substrate, and a gate metal wiring having a lower portion contacting the gate electrode and formed in a region surrounded by the sidewall insulation region.

Further, there is provided a manufacturing method of the present invention, including the steps of forming a first insulating layer on a substrate, forming an opening in the first insulating layer and etching the substrate exposed inside the opening to form a first trench and a second trench, forming a gate insulating film so as to cover bottom and side surfaces inside the first trench and the second trench, depositing a gate layer over the entire upper surface of the substrate until an upper surface thereof becomes flat, etching the gate layer until the upper surface thereof reaches a prescribed height between the bottom surface of each of the first trench and the second trench and the surface of the substrate to form a gate electrode, depositing a second insulating layer over the entire upper surface of the substrate until an upper surface thereof becomes flat, etching back the second insulating layer until an upper surface of the first insulating layer is exposed, selectively etching the second insulating layer on the gate electrode inside the second trench, selectively etching the first insulating layer around the first trench to expose the surface of the substrate around the first trench, depositing a third insulating layer over the entire upper surface of the substrate with a film thickness at which the second trench is not completely embedded, anisotropically etching the third insulating layer to leave a sidewall insulation region on a sidewall on the gate electrode in the second trench, and embedding and forming a gate metal in contact with the gate electrode in a region surrounded by the sidewall insulation region in the second trench.

According to the present invention, since a gate contact hole is formed in self-alignment with a trench, it is not necessary to expand the width of the trench in consideration of variations in manufacture, and hence a reduction in chip area is enabled.

DETAILED DESCRIPTION OF THE EMBODIMENTS

A semiconductor device according to the present invention will hereinafter be described in detail in accordance with embodiments with reference to the drawings.

Further, in the following embodiments, the present invention is embodied by an N channel type vertical trench MOSFET. Incidentally, the following description can similarly be applied even to a P channel type trench MOSFET by inverting a conductivity type of each region.

Figure 1:
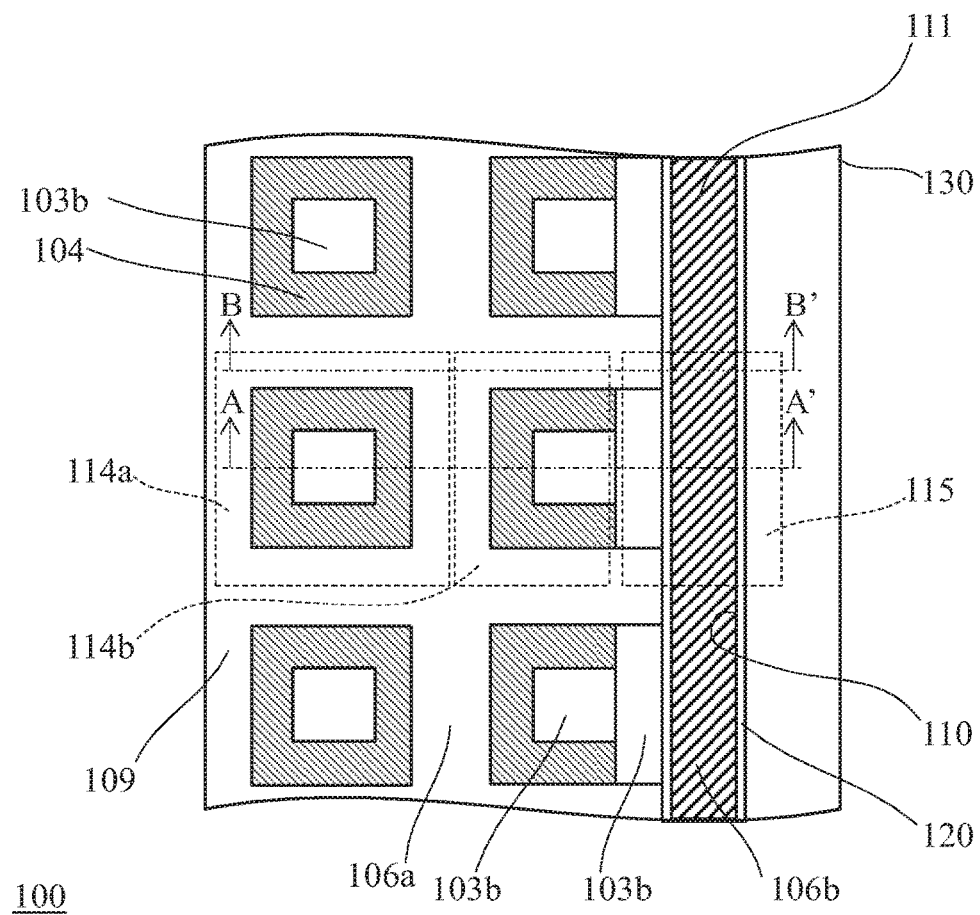
FIG. 1 is a partly plan view of a vertical MOSFET illustrating a first embodiment of the present invention.
Figure 2A:
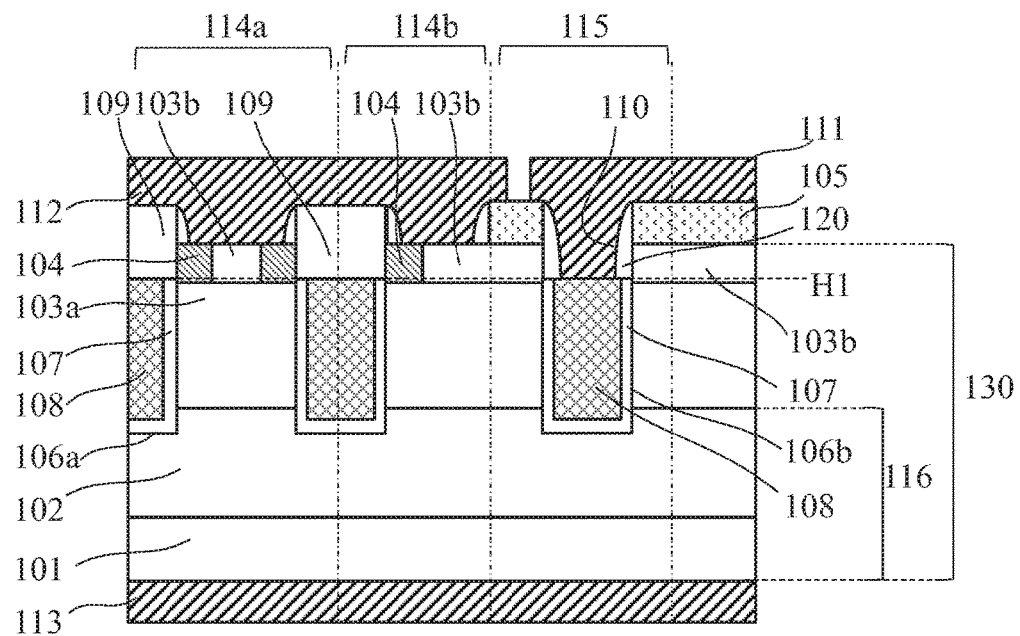
FIG. 2A is a schematic sectional view in the vicinity of line A-A' of FIG. 1
Figure 2B:
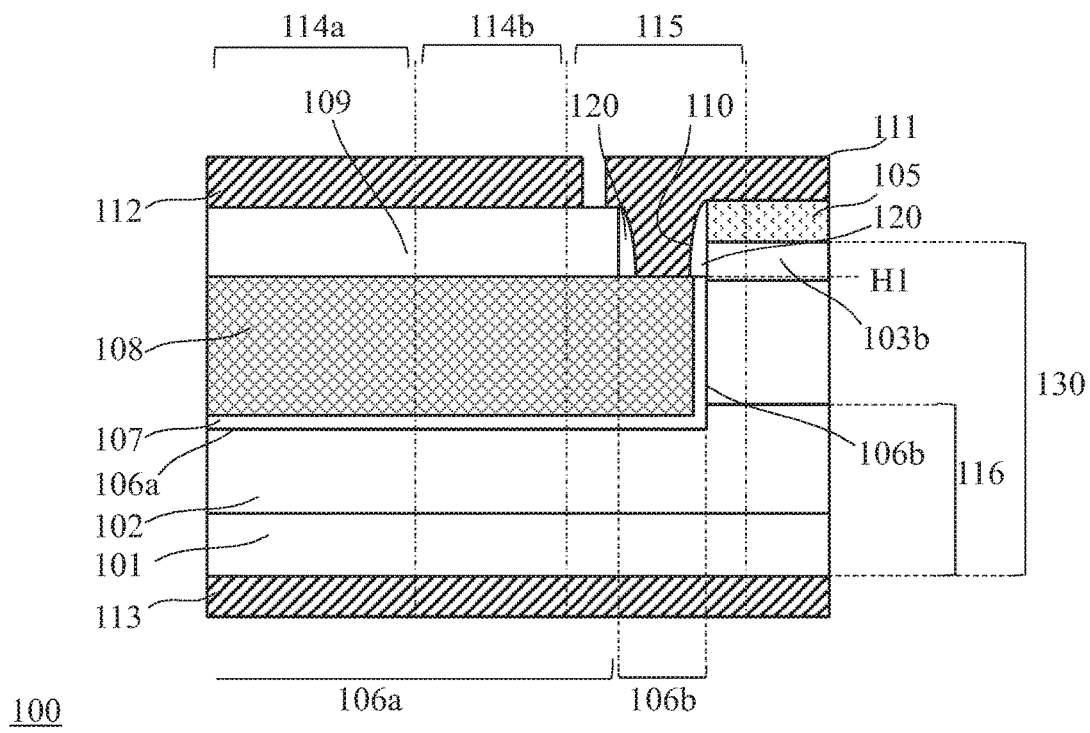
FIG. 2B is a schematic sectional view taken along line B-B' of FIG. 1.

FIG. 1 is a partly plan view of a semiconductor device 100 having a vertical trench MOSFET according to a first embodiment. FIG. 2A is a schematic sectional view in the vicinity of line A-A' of FIG. 1, and FIG. 2B is a schematic sectional view in the vicinity of line B-B' of FIG. 1.

FIG. 1 illustrates the manner of the vertical trench MOSFET having a lattice-like layout in the vicinity of the outer periphery of a chip (the same figure represents the manner of the surface of a substrate 130, and parts above the surface of the substrate 130 are omitted). The vertical trench MOSFET is equipped with, in order to cause a drain current to flow from back to front on the paper, a first cell region 114a configuring a vertical transistor including a first trench 106a, a cell outer peripheral region 115 including a second trench 106b connected to the first trench 106a, for leading the potential of a gate electrode (not illustrated) embedded into its corresponding trench to the outside thereof, and a second cell region 114b for matching mutual trench shapes between the first cell region 114a and the cell outer peripheral region 115. The trenches formed in these three regions, a gate insulating film formed on the bottom and side surfaces of each trench, and the gate electrode embedded into each trench are connected without a break, thereby making the potential of the gate electrode taken out from the cell outer peripheral region 115 to outside the trench be the same at any gate electrode lying inside the trench at any position.

The first cell region 114a is a lattice-like region sectioned between the center lines of the first trenches 106a adjacent to each other in the first trenches 106a which are intersected and arranged in all directions. The first cell region 114a is formed with a P-type base contact region 103b in its center and formed with an N-type source region 104 so as to surround four sides of the base contact region 103b. Further, the first cell region 114a is formed with the first trenches 106a so as to surround four sides of the source region 104. The gate electrode (not illustrated) on the bottom surface side, and a first interlayer insulating film 109 on its upper side are embedded into the first trench 106a. The first interlayer insulating film 109 is exposed at the surface of the substrate 130.

In the vertical trench MOSFET, a current flowing from a drain electrode (not illustrated) flows into the source region 104 through a channel (not illustrated) formed in the vicinity of a sidewall of the first trench 106a of the first cell region 114a and flows out to a source electrode (not illustrated) provided on the surface of the substrate 130.

The second cell region 114b has three sides surrounded by the first trenches 106a except for the direction in which the second cell region 114b is adjacent to the cell outer peripheral region 115. The source region 104 is provided along the first trench 106a. Further, the base contact region 103b is provided in such a manner that three sides thereof are surrounded by the source region 104. One side thereof which faces the cell outer peripheral region 115 is in contact with the cell outer peripheral region 115.

The cell outer peripheral region 115 is provided with a second trench 106b which extends in parallel in a first direction (vertical direction when viewed on the paper in FIG. 1) in which the second cell regions 114b are arranged in line, and which has the same width as the first trench 106a. Further, the first trench 106a extends from the second cell region 114b (horizontal left side on the paper in FIG. 1) to the second trench 106b along a second direction perpendicular to the first direction, and is connected to the second trench 106b. The base contact region 103b is provided between the first trench 106a and the second trench 106b.

The second trench 106b to which the end of the first trench 106a is connected is arranged so as to further surround a plurality of the first cell regions 114a and the second cell region 114b surrounding the first cell regions 114a over the chip outer periphery.

A sidewall insulation region 120 (side spacer) is provided inside the side surface of the second trench 106b. The inside of the sidewall insulation region 120 is assumed to be a gate contact hole 110, and a gate metal wiring 111 is provided inside the gate contact hole 110. The gate metal wiring 111 is connected to its corresponding gate electrode (not illustrated) provided at the lower portion of the inside of the second trench 106b. The sidewall insulation region 120 is provided so as to cover the side surface of the second trench 106b formed over the chip outer periphery. At a portion where the first trench 106a and the second trench 106b are connected, the first interlayer insulating film 109 embedded inside the first trench 106a, and the sidewall insulation region 120 are in contact with each other. Thereby, the gate metal wiring 111 in the gate contact hole 110 is surrounded by the sidewall insulation region 120 at the side surface inside the second trench 106b and electrically insulated to a region other than the gate electrode.

In general, the width of a trench for forming a channel of a transistor is formed with a process minimum processing width. Thereby, a huge layout area of trench is suppressed, and a chip area is reduced. On the other hand, a conventional trench width where a gate contact hole is formed on the trench to pull out a gate electrode is set to be larger than the gate contact hole in consideration of variations in manufacture such as a mask shift between the gate contact hole and the trench, etc. Hence, the trench at the gate electrode pull-out portion becomes larger than the trench for channel formation, and the suppression of an increase in chip area becomes difficult. In the first embodiment, the first trench 106a for channel formation and the second trench 106b are formed with the same process minimum processing with by forming the sidewall insulation region 120. This is because the gate contact hole 110 is formed inside the trench 106b in a self-alignment manner. It is hence possible to suppress the increase in the chip area.

Further, as illustrated in the sectional view (section taken along line A-A' of FIG. 1) of FIG. 2A, the semiconductor device 100 according to the first embodiment is fabricated using a substrate 130 in which a low concentration N-type epitaxial layer 102 is formed on an N+ type high concentration semiconductor substrate 101. The high concentration semiconductor substrate 101 and the epitaxial layer 102 inside the substrate 130 are both defined as a drain region 116 of a vertical trench MOSFET.

A P-type base region 103a higher in concentration than the epitaxial layer 102 is formed on the epitaxial layer 102 of the first cell region 114a. A high concentration P+ type base contact region 103b is provided on the base region 103a. An N+ type source region 104 is formed so as to surround the base contact region 103b. Further, a first trench 106a having a depth at which it penetrates the source region 104 and the base region 103a and reaches the epitaxial layer 102 is formed around the source region 104.

Inside the first trench 106a, a gate insulating film 107 covers the bottom surface of the first trench 106a and the side surface thereof from the bottom surface of the first trench 106a to a first height H1. A gate electrode 108 composed of polysilicon or the like is embedded on the gate insulating film 107 in the first trench 106a up to the first height H1. Further, a first interlayer insulating film 109 is provided up to a region from the first height H1 of the inside of the first trench 106a to a height exceeding the surface of the substrate 130.

A P-type base region 103a, a P+ type base contact region 103b, and a source region 104 are formed over the epitaxial layer 102 of the second cell region 114b as with the first cell region 114a. A first trench 106a is provided on the epitaxial layer 102 as with the first cell region 114a. The previously-described gate insulating film 107, gate electrode 108 and first interlayer insulating film 109 are provided inside the first trench 106a.

A source electrode 112 is provided on the surface of the substrate 130 formed with the first cell region 114a and the second cell region 114b, and the first interlayer insulating film 109, and hence a source potential is supplied to the source region 104 and the base contact region 103b. Further, a drain electrode 113 is provided on the back surface of the substrate 130, and hence a drain potential is supplied to the drain region 116 comprised of the high concentration semiconductor substrate 101 and the epitaxial layer 102.

In the cell outer peripheral region 115, a P-type base region 103a is formed on the epitaxial layer 102 in a manner similar to the first cell region 114a and the second cell region 114b. A P+ type base contact region 103b is formed on the base region 103a. A second trench 106b having a depth at which it penetrates the base region 103a and reaches the epitaxial layer 102 is formed in the cell outer peripheral region 115, but the width and depth thereof are the same as those of the first trench 106a.

Inside the second trench 106b, a gate insulating film 107 covers the bottom surface of the second trench 106b and the side surface thereof from the bottom surface of the second trench 106b to the first height H1 as with the first trench 106a. A gate electrode 108 composed of polysilicon or the like is embedded on the gate insulating film 107 in the second trench 106b up to the first height H1.

However, unlike the first trench 106a, a mask insulating film 105 is provided on the surface of the substrate 130 around the second trench 106b. An opening of the same size for the mask insulating film 105 is provided on an opening of the second trench 106b. Further, a sidewall insulation region 120 is provided on an opening side surface which exceeds the surface of the substrate 130 from the first height H1 of the inside of the second trench 106b and reaches up to the upper surface of the mask insulating film 105. The sidewall insulation region 120 is a side spacer of a second interlayer insulating film, which is formed by anisotropically etching the second interlayer insulating film to be described later. The sidewall insulating region 120 is provided from the upper surface of the gate electrode 108 to an uppermost end of the second trench 106b as the side spacer. Here, the uppermost end of the second trench 106b corresponds to an upper surface end of the mask insulating film 105. Since a lower portion of the sidewall insulation region 120 exists between the upper surface of the gate electrode 108 and the upper surface of the substrate 130, the P+ type base contact region 103b is not exposed to the inside of the second trench 106b. In the sidewall insulation region 120, the thickness thereof at its opening side surface is 1000 Å or more, and a breakdown voltage for insulation at which the sidewall insulation region 120 is not broken even with respect to a gate potential of 80V or more, is held. As compared with a conventional structure in which a gate insulating film of a few 100 Å is made to extend from the inside of a trench to the outside of the trench via its upper corner portion to thereby insulate a gate electrode formed thereon, the first embodiment is high in insulation against an excessive gate potential and also includes long-term reliability in which the insulation is maintained over a long period of time.

A gate metal wiring 111 is formed inside the sidewall insulation region 120. The gate metal wiring 111 is electrically connected to the gate electrode 108 lying inside the second trench 106b and supplies a gate potential given from a gate pad (not illustrated) formed outside the second trench 106b to the gate electrode 108. The previous sidewall insulation region 120 serves as the gate contact hole 110 relative to the gate electrode 108.

Further, as represented in the sectional view (section taken along line B-B' of FIG. 1) of FIG. 2B, the trench 106a running in the lateral direction of the paper is connected to the trench 106b directed from the front toward the back of the paper. Further, the gate electrode 108 embedded into the trench 106a is provided up to the inside of the trench 106b without a break. The gate electrode 108 lying inside the trench 106b is connected to the gate metal wiring 111 through the gate contact hole 110 surrounded by the sidewall insulation region 120. Thus, the gate electrode 108 embedded inside the trench 106b is not pulled out to the outside of the trench 106b through the upper corner portion thereof. Further, the trench upper corner portion is surrounded by the sidewall insulation region 120 and the mask insulating film 105, permitting the gate metal wiring 111 to have a high breakdown voltage for insulation against the substrate 130.

In the first embodiment as described above, the gate contact hole is formed directly on the trench and connected with the gate metal wiring without forming the gate electrode on the gate insulating film at the trench upper corner portion low in gate breakdown voltage for insulation to pull out the gate electrode to the outside of the trench as in the related art. Accordingly, high reliability against the breakdown of the gate insulating film and at the same time a reduction in gate resistance are made possible. Further, since the gate contact hole is formed in self-alignment with respect to the trench, the trench width can be formed with a process minimum processing width, and a reduction in chip area is made possible.

A manufacturing method of the semiconductor device according to the first embodiment will next be described while referring to FIGS. 3 to 11. FIGS. 3 to 11 all correspond to the sectional views in the vicinity of line A-A' of FIG. 1.

Figure 3:
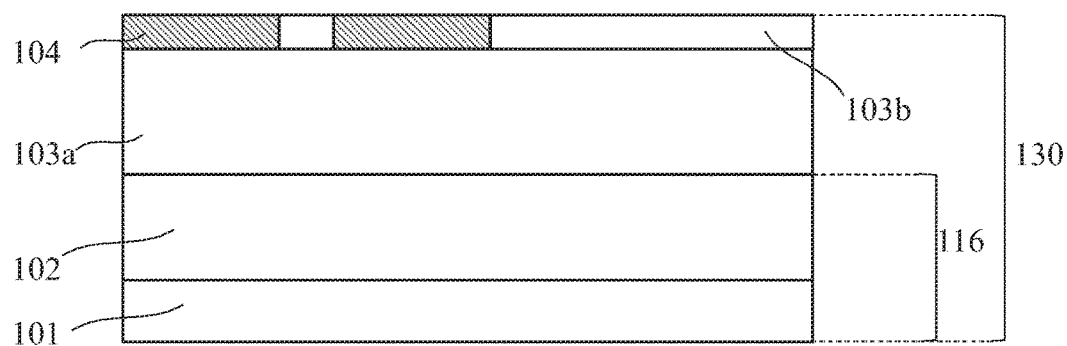
FIG. 3 is a sectional diagram illustrating a manufacturing process of a semiconductor device illustrating the first embodiment.

First, a substrate 130 provided with an N-type epitaxial layer 102 on an N+ type high concentration semiconductor substrate 101 containing a high concentration impurity is prepared as illustrated in FIG. 3. Next, a P-type base region 103a is formed from the substrate 130 by ion implantation and thermal diffusion. Then, an N+ type source region 104 and a base contact region 103b higher in concentration than the base region 103a are formed from the surface of the substrate 130. At this time, in the substrate 130, the portions being the high concentration semiconductor substrate 101 and the epitaxial layer 102, which are provided on the lower side of the base region 103a become a drain region 116.

Figure 4:
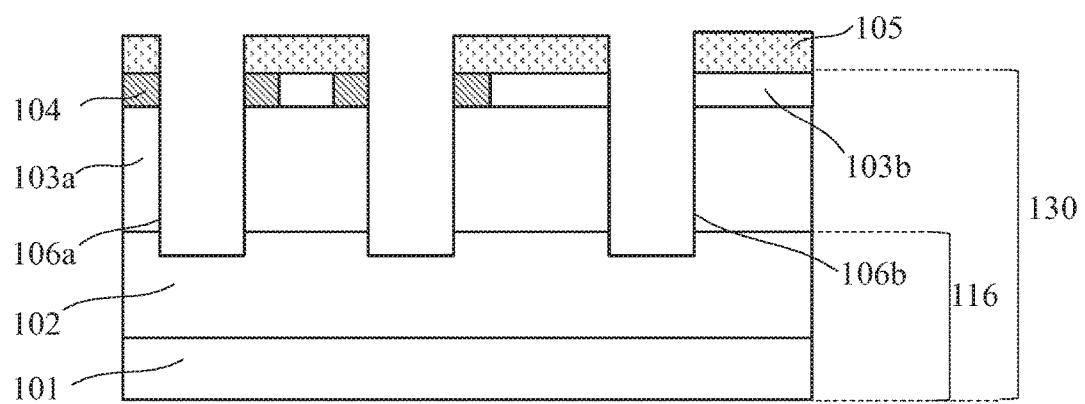
FIG. 4 is a sectional view illustrating a manufacturing process of the semiconductor device illustrating the first embodiment.

Next, as illustrated in FIG. 4, an insulating film is deposited on the substrate 130 with a film thickness of 1000 Å or more by an LPCVD (Low Pressure Chemical Vapor Deposition) method. Then, a scheduled region for trench formation in the insulating film is etched to expose the surface of the substrate 130, thereby forming a mask insulating film 105. Next, silicon etching is performed with the mask insulating film 105 as a mask to form a first trench 106a and a second trench 106b which penetrate the source region 104 and the base region 103a and reach the drain region 116.

Figure 5:
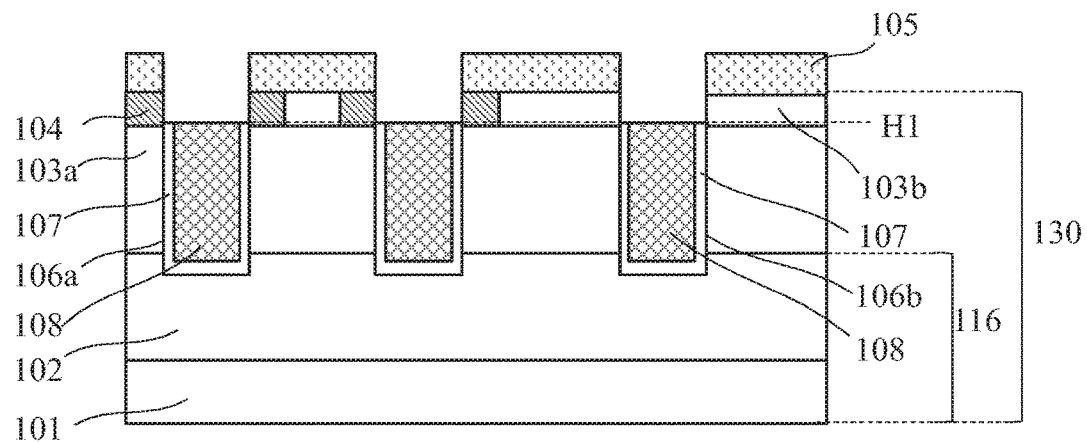
FIG. 5 is a sectional view illustrating a manufacturing process of the semiconductor device illustrating the first embodiment.

Next, as illustrated in FIG. 5, a gate insulating film 107 is formed so as to cover the inside bottom and side surfaces of the first trench 106a and the second trench 106b while leaving the mask insulating film 105. Then, a gate layer composed of conductive polysilicon or the like is deposited over the entire surface of the substrate until its upper surface gets flat. Next, the gate layer is etched back to a first height H1 to form a gate electrode 108 inside each of the first trench 106a and the second trench 106b. The first height H1 sets the position between the surface of the substrate 130 and the bottom surface of the source region 104 in such a manner that a channel break does not occur between the source region 104 and the drain region 116. In order to achieve a reduction in gate-to-source capacitance and a reduction in the occurrence of a gate-to-source short-circuit failure, the first height H1 is preferably the same position as the bottom surface of the source region 104.

Figure 6:
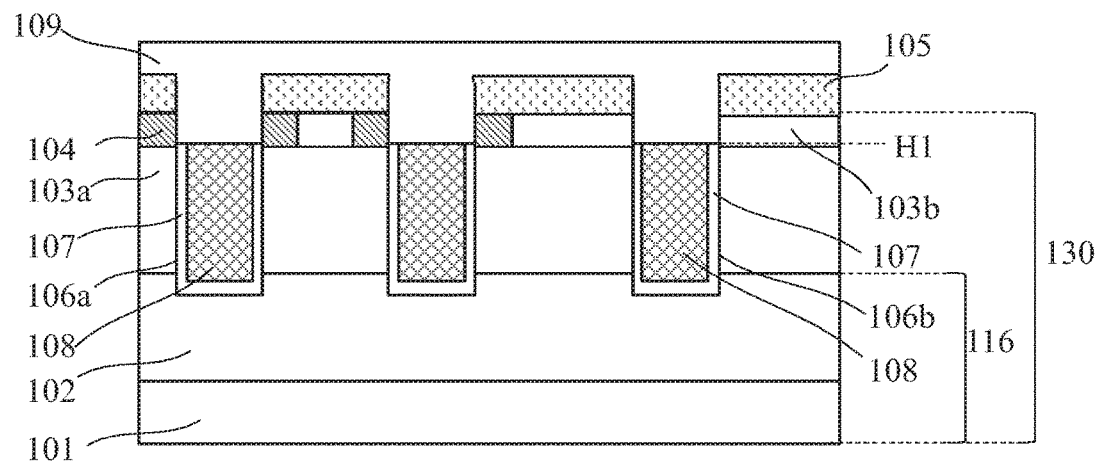
FIG. 6 is a sectional view illustrating a manufacturing process of the semiconductor device illustrating the first embodiment.

Next, as illustrated in FIG. 6, a first interlayer insulating film 109 is deposited on the substrate 130 by the LPCVD method over the entire surface thereof until an upper surface which has some steps is planarized. For example, when the widths of the first trench 106a and the second trench 106b are 0.5 µm, the first interlayer insulating film 109 is preferably deposited in more than a thickness of 0.5 µm for planarization of the upper surface. The first interlayer insulating film 109 adopts a film having etching selectivity relative to the mask insulating film 105. For example, a silicon oxide film may be combined with the mask insulating film 105, and a silicon nitride film may be combined with the first interlayer insulating film 109.

Figure 7:
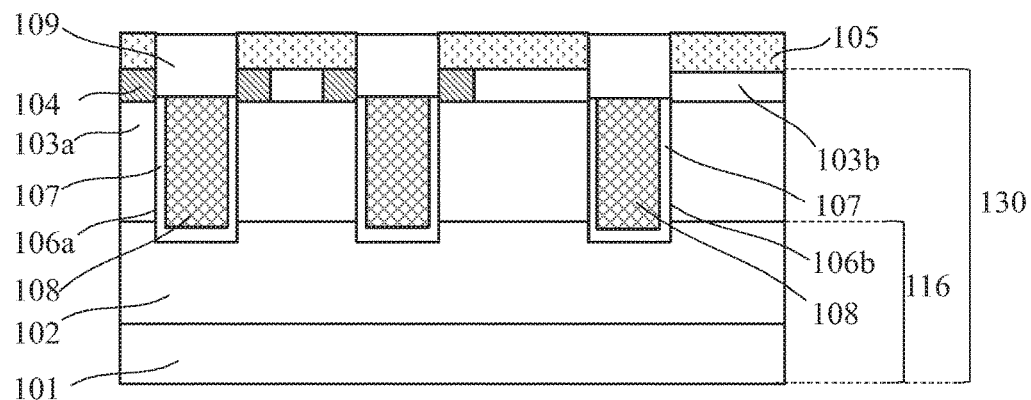
FIG. 7 is a sectional view illustrating a manufacturing process of the semiconductor device illustrating the first embodiment.

Next, as illustrated in FIG. 7, the first interlayer insulating film 109 is etched back to expose the mask insulating film 105 to a region other than the first trench 106a and the second trench 106b. At this time, since etching is stopped by an end point detection or the like with the exposure of the surface of the mask insulating film 105, the first interlayer insulating film 109 is left in a state in which the upper surface is positioned above the surface of the substrate 130. Accordingly, even when over-etching is excessively conducted due to variations in etching or the like, the first interlayer insulating film 109 is removed until the gate electrode 108 is exposed, and hence occurrence of a short-circuit failure between the gate electrode 108 and a source electrode formed later can be prevented.

Figure 8:
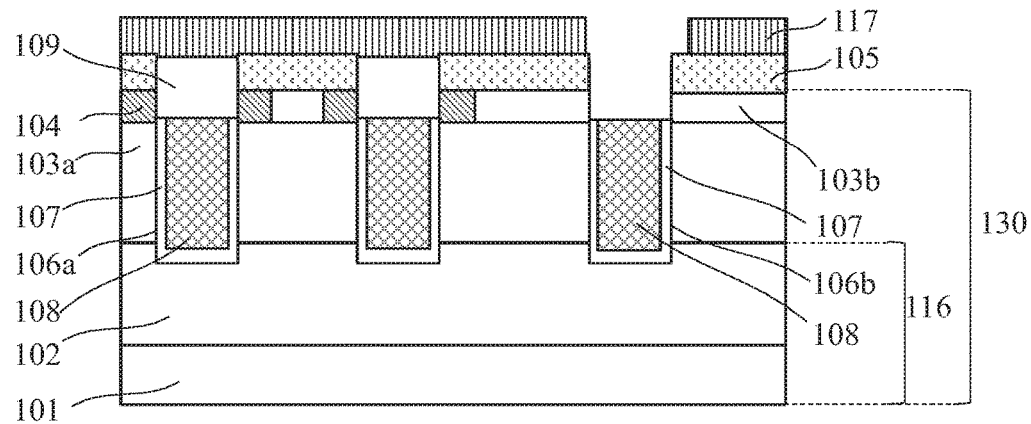
FIG. 8 is a sectional view illustrating a manufacturing process of the semiconductor device illustrating the first embodiment.

Next, as illustrated in FIG. 8, after a photoresist 117 covers over the substrate 130, the photoresist 117 above the second trench 106b and at its periphery is made open by a photolithography technology. Then, the first interlayer insulating film 109 in the second trench 106b is removed by a method such as wet etching or the like with each of the photoresist 117 and the partly-exposed mask insulating film 105 as a mask to thereby expose the gate electrode 108 inside the second trench 106b.

Figure 9:
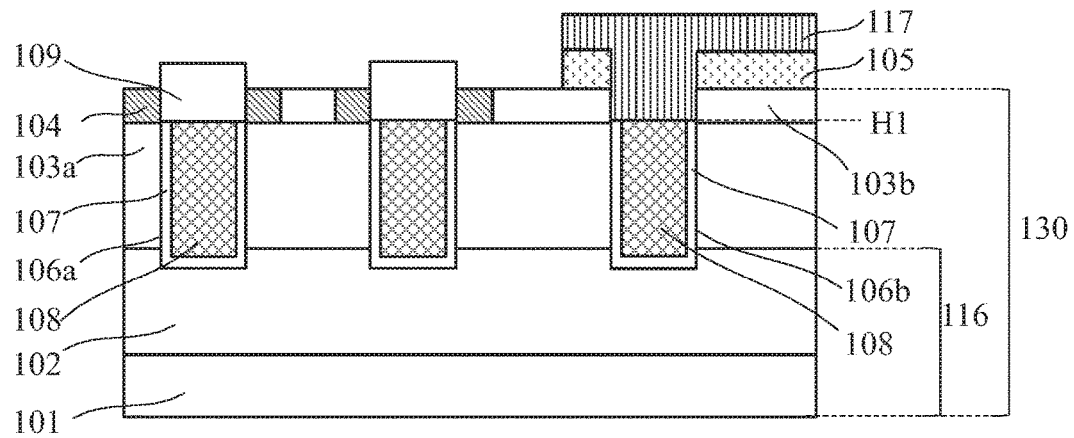
FIG. 9 is a sectional view illustrating a manufacturing process of the semiconductor device illustrating the first embodiment.

Next, as illustrated in FIG. 9, after the photoresist 117 covers over the substrate 130, the photoresist 117 in a region other than above the second trench 106b and its periphery is made open by the photolithography technology. Then, with the photoresist 117 as a mask, the mask insulating film 105 around the first trench 106a is removed to expose the source region 104 and the base contact region 103b at the surface of the substrate 130.

Figure 10:
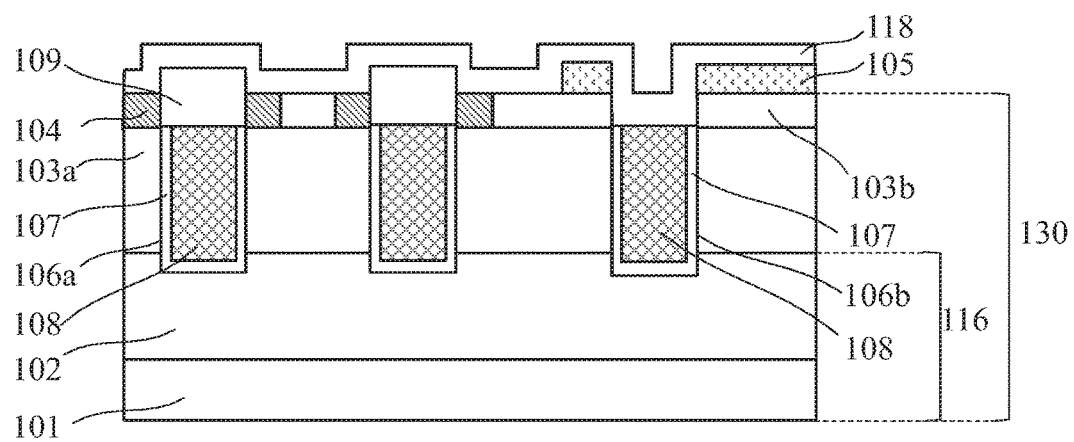
FIG. 10 is a sectional view illustrating a manufacturing process of the semiconductor device illustrating the first embodiment.

Next, as illustrated in FIG. 10, a second interlayer insulating film 118 is deposited over the entire surface of the substrate 130 by the LPCVD method with such a degree of film thickness that the second trench 106b is not buried completely. By depositing the second interlayer insulating film 118 with a film thickness of 0.1 to 0.2 µm, for example, the second interlayer insulating film 118 with nearly equal thickness at the bottom surface of the second trench 106b and the outside thereof can be formed without completely burying the second trench 106b.

Figure 11:
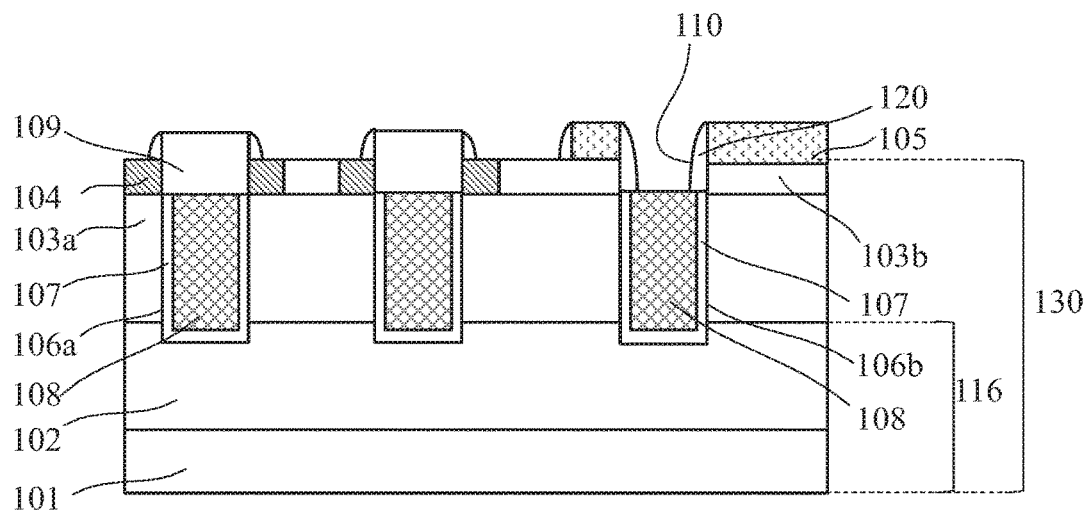
FIG. 11 is a sectional view illustrating a manufacturing process of the semiconductor device illustrating the first embodiment.

Next, as illustrated in FIG. 11, the second interlayer insulating film is etched back by anisotropic dry etching to expose the source region 104 and the base contact region 103b at the surface of the substrate 130 again. At this time, for example, when the first interlayer insulating film 109 and the second interlayer insulating film 118 are formed of a film having the same material, there is a possibility that the first interlayer insulating film 109 will excessively be etched in this process. Since, however, the upper surface of the first interlayer insulating film 109 on the first trench 106a is in a state of being positioned above the surface of the substrate 130, the first interlayer insulating film 109 is removed until the gate electrode 108 lying inside the first trench 106a is exposed, and thereby occurrence of a short-circuit failure between the gate electrode 108 and the source electrode formed later can be prevented.

On the other hand, since the anisotropic dry etching is adopted, a side spacer of the second interlayer insulating film is left at a steep step portion. Accordingly, a side spacer is formed as the sidewall insulation region 120 even at the side surface higher than the first height H1 in the second trench 106b so as to cover the base contact region 103b. The sidewall insulation region 120 being the side spacer is provided from the surface of the gate electrode 108 to the uppermost end of the second trench 106b.

Since the thickness formed on the side wall of the sidewall insulation region 120 is proportional to the deposited film thickness of the second interlayer insulating film, such a deposited film thickness that a sidewall insulation region 120 having a thickness of 0.1 µm or more is formed can be selected freely. Since the sidewall insulation region 120 is a film which is dense and good in quality, using the LPCVD method, a breakdown voltage for insulation of 80V or more can be ensured when a thickness of 0.1 µm is given.

On the other hand, in a general method of performing insulation by a gate insulating film, the film thickness thereof is restricted by a request specification and is about a few 100 Å, and a difficulty arises in freely selecting the film thickness. Further, it is difficult to suppress reductions in the breakdown voltage for insulation and reliability due to an oxidation growth failure around an upper corner portion of a trench.

In contrast, in the manufacturing method of the present embodiment, the upper corner portion of the second trench 106*b* is surrounded by the mask insulating film 105 and the sidewall insulation region 120 of good quality and 1000 Å or more in thickness by LPCVD, it is possible to suppress reductions in the breakdown voltage for insulation and reliability.

Since the sidewall insulation region 120 simply maintains insulation relative to the base contact region 103*b* at the inside side surface of the second trench 106*b* and partly covers the surface of the gate electrode 108 at its lower portion, the sidewall insulation region 120 can be made to function as a gate contact hole 110.

Next, a wiring layer composed of aluminum or the like is formed on the surface of the substrate. Further, the wiring layer is selectively removed. Thereby, a source electrode and a gate metal wiring are formed on the surface thereof, whereby such a configuration as illustrated in FIG. 2A and FIG. 2B is obtained. Thereafter, a passivation film is formed on these, and an opening for wiring such as bonding or the like is formed (not illustrated). The semiconductor device according to the first embodiment is obtained by forming a drain electrode on the back surface of the substrate 130 at last.

In the above-described manufacturing method according to the first embodiment, since the gate contact hole is formed on the self-alignment basis without using the photolithography technology, the second trench 106*b* of the cell outer peripheral region 115 is not required to extend more than the first trench 106*a*, and hence a chip area can be reduced.

Since the width of each trench is the same even in any region, it is possible to suppress embedding failures and flatness variations of the gate electrode and the interlayer insulating film as compared with the case where the trenches different in width coexist, thus making it possible to enhance the yield and suppress a reduction in reliability due to shape abnormalities. Further, since the upper surface of the insulating film on the first trench 106*a* is set higher than the surface of the substrate, it is possible to suppress a short-circuit failure between the gate electrode and the source electrode due to variations in manufacturing and enhance the yield.

Further, since the photomask for source contact opening becomes unnecessary not only in the cell outer peripheral region but also in the first cell region, this can contribute to a reduction in the chip area of the entire vertical MOSFET with the trench gate.

Figure 12:
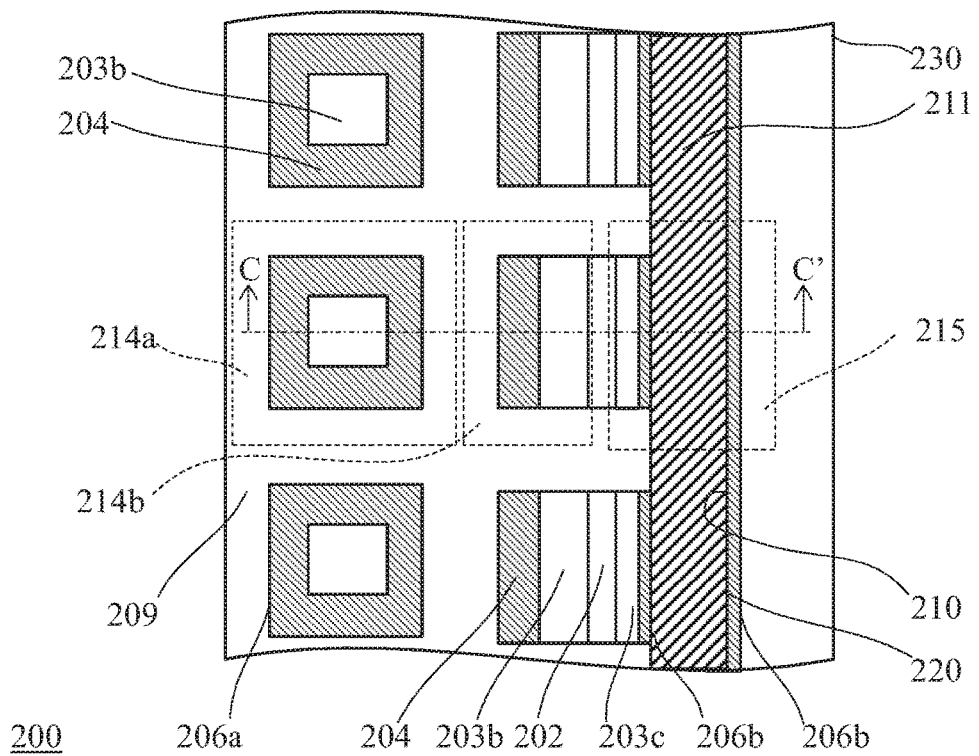
FIG. 12 is a partly plan view of a vertical trench MOSFET illustrating a second embodiment.
Figure 13:
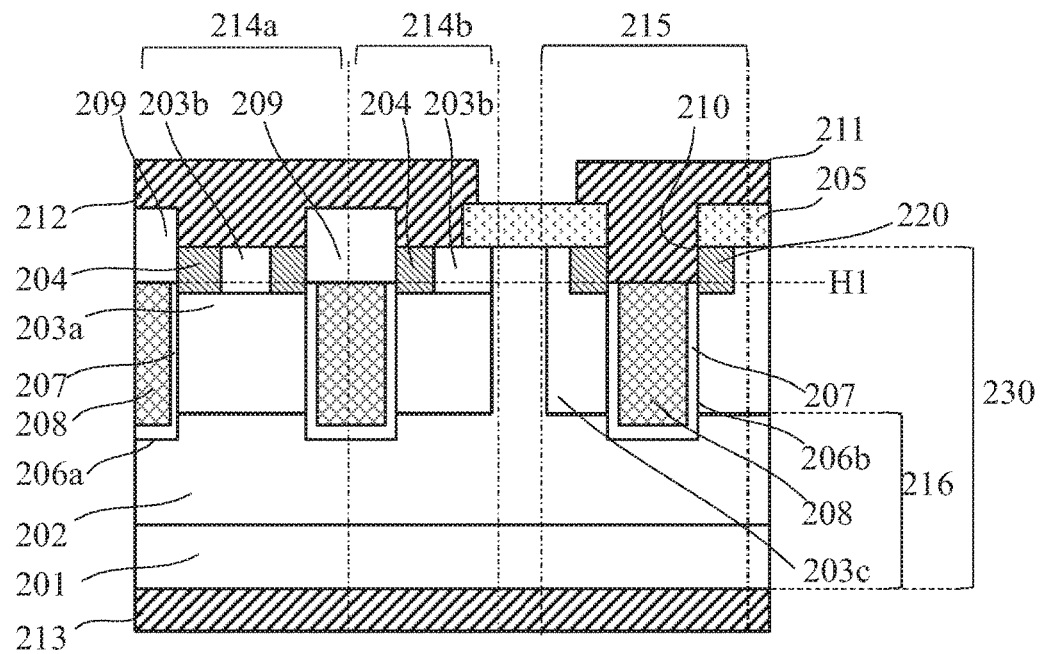
FIG. 13 is a schematic sectional view in the vicinity of line C-C' of FIG. 12.

A second embodiment will next be described. FIG. 12 is a partly plan view of a semiconductor device 200 having a vertical trench MOSFET according to the second embodiment. FIG. 13 is a schematic sectional view taken in the vicinity of line C-C' of FIG. 12.

FIG. 12 illustrates the manner of a vertical trench MOSFET having a lattice-like layout in the vicinity of the outer periphery of a chip (the same figure represents the manner of the surface of a substrate 230, and parts above the surface of the substrate 230 are omitted). The vertical trench MOSFET is equipped with, in order to cause a drain current to flow from back to front on the paper, a first cell region 214*a* configuring a vertical transistor including a first trench 206*a*, a cell outer peripheral region 215 including a second trench 206*b* connected to the first trench 206*a*, for leading out the potential of a gate electrode embedded into its corresponding trench to the outside thereof, and a second cell region 214*b* for matching mutual trench shapes between the first cell region 214*a* and the cell outer peripheral region 215. Since the trenches formed in these three regions, a gate insulating film formed at the bottom and side surfaces of each trench, and gate electrodes (not illustrated) each embedded into the trench are connected without a break, the potential of the gate electrode taken out from the cell outer peripheral region 215 to the trench outside becomes the same at any gate electrode lying inside the trench at any position.

The first cell region 214*a* is formed with a P-type base contact region 203*b* in the center thereof and formed with an N-type source region 204 so as to surround four sides of the base contact region 203*b*. Further, the first cell region 214*a* is formed with a first trench 206*a* so as to surround four sides of the source region 204.

The second cell region 214*b* has three sides surrounded by the first trench 206*a* except for the direction in which the second cell region 214*b* is adjacent to the cell outer peripheral region 215. A source region 204 is provided in a direction on the side opposite to the cell outer peripheral region 215, and a base contact region 203*b* is provided at the remaining portion of the second cell region 214*b*.

The cell outer peripheral region 215 is equipped with a first trench 206*a* of the same width on the extension of the first trench 206*a* of the second cell region 214*b* and equipped with a second trench 206*b* with being connected to the end of the first trench 206*a*. A P-type second base region 203*c* is provided on the second cell region 214*b* side of the cell outer peripheral region 215. The second base region 203*c* and the base contact region 203*b* of the second cell region 214*b* are separated from each other by an N-type epitaxial layer 202. No metal wiring is connected above the second base region 203*c*, and the potential at the second base region 203*c* becomes a floating potential during operation of the transistor.

The second trench 206*b* within the cell outer peripheral region 215, which is connected with the end of the first trench 206*a* is formed so as to surround a plurality of first cell regions 214*a* and second cell regions 214*b* on the whole over the outer periphery of the chip. The width of the second trench 206*b* is the same as the width of the first trench 206*a*.

An N+ type sidewall insulation region 220 formed by the same process and impurity as in the source region 204 is provided outside the side surface of the second trench 206*b*. The inside of the sidewall insulation region 220 is assumed to be a gate contact hole 210, and a gate metal wiring 211 is provided inside the gate contact hole 210. The gate metal wiring 211 is connected to a lower gate electrode (not illustrated) inside the second trench 206*b*, and the sidewall insulation region 220 at the side surface of the second trench 206*b*.

At a portion where the first trench 206*a* and the second trench 206*b* are connected, a first interlayer insulating film 209 embedded into the first trench 206*a* is in contact with the gate metal wiring 211. Thereby, the gate metal wiring 211 in the gate contact hole 210 is all surrounded by the first insulating film 209 and the sidewall insulation region 220 inside the second trench 206*b* and electrically insulated to a region other than the gate electrode.

Further, as illustrated in the sectional view (section taken along line C-C' of FIG. 12) of FIG. 13, the source region 204 is formed deeper than a first height H1 at the upper surface of the gate electrode 208 in the first cell region 214*a* in the second embodiment.

The first base region 203*a* in the second cell region 214*b* is separated from the second base region 203*c* in the cell outer peripheral region 215 through the epitaxial layer 202. This is because the first base region 203*a* in the second cell region 214*b* is fixed to a source potential, whereas the second base region 203c in the cell outer peripheral region 215 is set to be a floating potential without its potential being fixed.

The sidewall insulation region 220 is formed at the side surface of the second trench 206b in the cell outer peripheral region 215. The sidewall insulation region 220 is an N+ type diffusion region formed by the same process and impurity as in the source region 204 and is formed deeper than the first height H1 at the upper surface of the gate electrode 208. Thus, in the cell outer peripheral region 215, an N+ diffusion layer to be the sidewall insulation region 220 is formed deeper than the gate metal wiring 211 to enable the gate metal wiring 211 to be electrically insulated from a region other than the gate electrode.

The second base region 203c is formed to surround the sidewall insulation region 220 by an impurity of a conductivity type reverse to the diffusion layer forming the sidewall insulation region 220 and kept at a floating potential. The second base region 203c is formed by the same process and impurity as in the P-type first base region 203a.

Figure 14:
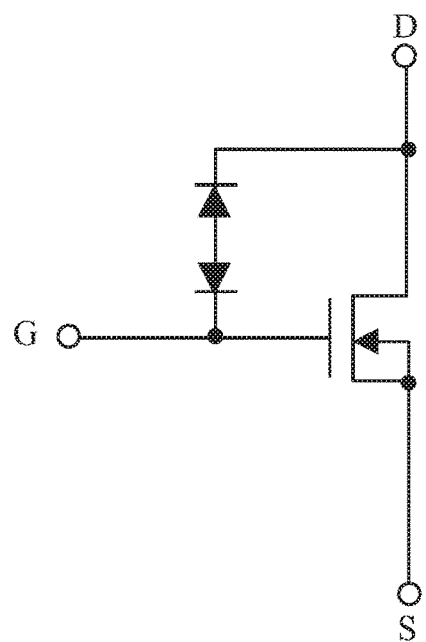
FIG. 14 is a typical circuit diagram of a semiconductor device illustrating the second embodiment of the present invention.

Since the second base region 203c is surrounded by the N-type epitaxial layer 202 in a drain region 216, as illustrated in FIG. 14, a gate terminal G is configured to be connected to a drain terminal D through two bidirectionally-connected PN diodes formed by the N-type sidewall insulation region 220, the P-type second base region 203c, and the N-type drain region 216. Thereby, flow of a leakage current between the gate terminal G and the drain terminal D is prevented.

The above region surrounded by the sidewall insulation region 220 and the mask insulating film 205 is assumed to be the gate contact hole 210, and the gate metal wiring 211 is formed on the gate electrode 208 whose surface is exposed, whereby a gate potential is taken out to the outside of the second trench 206b. Since the depth of the sidewall insulation region 220 is formed deeper than the first height H1 at the surface of the gate electrode 208, the gate metal wiring 211 is not brought into contact with the second base region 203c.

In the second embodiment, since the insulation is achieved by PN junction isolation instead of by the method of extending the conventional gate insulating film from the inside of the trench to the outside thereof via the trench upper corner portion and insulating the gate electrode formed thereon from other electrodes, the gate-voltage breakdown and reliability degradation at the upper corner portion of the gate insulating film are prevented. Further, in order to pull out the gate electrode to the outside of the trench, the gate contact hole is formed directly on the trench to connect the gate wiring electrode. Hence, high reliability against the breakdown of the gate insulating film, and at the same time a reduction in gate resistance are made possible.

Also, since the gate contact hole is formed in self-alignment with the trench, the width of the trench is not required to extend in consideration of mask misalignment with the gate contact hole, etc., and a reduction in chip area is made possible.

Further, since the PN junction insulation-returnable even after the avalanche breakdown is utilized for insulation isolation, it can be made to function even as the protection of the gate insulating film against excessive electrostatic noise invaded into the gate electrode.

The manufacturing method according to the second embodiment is different from the first embodiment in that the source region 104 of FIG. 5 is formed deeper than the first height H1, and the N+ type sidewall insulation region 220 formed by the same process and impurity is newly provided. Further, the formation of the second interlayer insulating film 118 illustrated in FIG. 10, and the etchback of the second interlayer insulating film illustrated in FIG. 11 are unnecessary. Accordingly, the manufacturing method according to the second embodiment has an advantage in that the semiconductor device can be manufactured in fewer processes than the first embodiment while having the advantage of the first embodiment.

Although the embodiments of the present invention have been described above, the present invention is not limited to the above embodiments. It is needless to say that various changes can be made thereto within the scope not departing from the gist of the present invention. For example, although the vertical MOSFET of the present embodiment has been described using the example in which the trenches are laid out in a lattice form, the present invention is not limited to it particular. The present invention can be applied even to a vertical MOSFET having a zigzag layout in which lattices are arranged with being shifted by one row, or a stripe-shaped layout in which trenches are provided to linearly extend in one direction.

What is claimed is:

1. A semiconductor device comprising:
   a cell region on a substrate and including a vertical transistor having a first trench;
   a cell outer peripheral region having a second trench connected to the first trench;
   a gate insulating film on a bottom surface and a side surface of the first trench and on a bottom surface and a side surface of the second trench up to a first height; and
   a gate electrode embedded up to the first height inside each of the first and second trenches along the gate insulating film,
   the cell outer peripheral region configured to pull out a potential of the gate electrode, and having:
      a sidewall insulation region contacting the side surface of the second trench from the first height to an upper surface of the substrate, the first height lower than the upper surface of the substrate and higher than the bottom surface of the second trench; and
      a gate metal wiring having a lower portion surrounded by and in contact with the sidewall insulation region and contacting an entire upper surface of the gate electrode, the gate metal wiring in a region above the first height inside the second trench.

2. The semiconductor device according to claim 1, wherein a width of the first trench and a width of the second trench are substantially the same.

3. The semiconductor device according to claim 2, wherein a second insulating film having an upper portion at a position higher than an upper end of the first trench is on the gate electrode in the first trench.

4. The semiconductor device according to claim 1, wherein the sidewall insulation region comprising a first insulating film along an inside portion of the side surface of the second trench.

5. The semiconductor device according to claim 4, wherein a second insulating film having an upper portion at a position higher than an upper end of the first trench is on the gate electrode in the first trench.

6. The semiconductor device according to claim 1, wherein a second insulating film having an upper portion at a position higher than an upper end of the first trench is on the gate electrode in the first trench.

7. A semiconductor device comprising:
a cell region on a substrate and including a vertical transistor having a first trench;
a cell outer peripheral region having a second trench connected to the first trench;
a gate insulating film on a bottom surface and a side surface of the first trench and on a bottom surface and a side surface of the second trench up to a first height; and
a gate electrode embedded up to the first height inside each of the first and second trenches along the gate insulating film,
the cell outer peripheral region configured to pull out a potential of the gate electrode, and having:
a sidewall insulation region along the side surface of the second trench from the first height lower than a surface of the substrate and higher than the bottom surface of the second trench to a second height of the surface of the substrate; and
a gate metal wiring having a lower portion contacting the gate electrode and in a region above from the first height inside the second trench, surrounded by the sidewall insulation region
wherein the sidewall insulation region comprises an impurity diffusion region in the substrate along an outside portion of the side surface of the second trench.

8. The semiconductor device according to claim 7, wherein a second insulating film having an upper portion at a position higher than an upper end of the first trench is on the gate electrode in the first trench.

9. A semiconductor device comprising:
a substrate;
a cell region on the substrate and including a vertical transistor having a first trench; and
a cell outer peripheral region having a second trench connected to the first trench,
each of the first trench and the second trench having:
a gate insulating film on a bottom surface and a side surface thereof, and
a gate electrode embedded in the first trench and the second trench respectively along the gate insulating film,
the cell outer peripheral region having:
a sidewall insulation region along and in contact with one of an inside surface or an outside surface of the second trench at least from an upper end of the gate electrode to an uppermost surface of the substrate, and
a gate metal wiring in a region surrounded by and in contact with an entire upper end of the gate electrode in the second trench and the sidewall insulation region.

10. The semiconductor device according to claim 9, wherein a width of the first trench and a width of the second trench are substantially the same.

11. The semiconductor device according to claim 10, wherein a second insulating film having an upper portion at a position higher than an upper end of the first trench is on the gate electrode in the first trench.

12. The semiconductor device according to claim 9, wherein the sidewall insulation region comprises a first insulating film along an inside portion of the side surface of the second trench.

13. The semiconductor device according to claim 12, wherein a second insulating film having an upper portion at a position higher than an upper end of the first trench is on the gate electrode in the first trench.

14. The semiconductor device according to claim 9, wherein a second insulating film having an upper portion at a position higher than an upper end of the first trench is on the gate electrode in the first trench.

15. The semiconductor device according to claim 9, wherein a second insulating film having an upper portion at a position higher than an upper end of the first trench is on the gate electrode in the first trench.

16. A semiconductor device comprising:
a substrate;
a cell region on the substrate and including a vertical transistor having a first trench; and
a cell outer peripheral region having a second trench connected to the first trench,
each of the first trench and the second trench having:
a gate insulating film on a bottom surface and a side surface thereof, and
a gate electrode embedded in the first trench and the second trench respectively along the gate insulating film,
the cell outer peripheral region having:
a sidewall insulation region along one of an inside surface or an outside surface of the second trench at least from an upper end of the gate electrode to an uppermost surface of the substrate, and
a gate metal wiring in a region surrounded by an upper end of the gate electrode in the second trench and the sidewall insulation region
wherein the sidewall insulation region comprises an impurity diffusion region in the substrate along an outside portion of the side surface of the second trench.

17. The semiconductor device according to claim 16, wherein a second insulating film having an upper portion at a position higher than an upper end of the first trench is on the gate electrode in the first trench.

* * * * *